(12) United States Patent
Lin et al.

(10) Patent No.: US 7,739,646 B2
(45) Date of Patent: Jun. 15, 2010

(54) ANALOG AND MIXED SIGNAL IC LAYOUT SYSTEM

(75) Inventors: Po-Hung Lin, Zhubei (TW); Ho-Che Yu, Kaohsiung (TW); Tian-Hau Tsai, Shulin (TW); Shyh-Chang Lin, Hsinchu (TW); Shi-Hong Bai, Hsinchu (TW)

(73) Assignee: Springsoft, Inc., Hsinchu (TW)

( * ) Notice: Subject to any disclaimer, the term of this patent is extended or adjusted under 35 U.S.C. 154(b) by 151 days.

(21) Appl. No.: 11/839,042

(22) Filed: Aug. 15, 2007

(65) Prior Publication Data

US 2008/0092099 A1    Apr. 17, 2008

Related U.S. Application Data

(60) Provisional application No. 60/851,840, filed on Oct. 12, 2006.

(51) Int. Cl.
*G06F 17/50* (2006.01)
(52) U.S. Cl. ............................ 716/11; 716/8; 716/12
(58) Field of Classification Search ........................ None
See application file for complete search history.

(56) References Cited

U.S. PATENT DOCUMENTS 7,418,683 B1 * 8/2008 Sonnard et al. ............... 716/5
7,543,262 B2 * 6/2009 Wang et al. ................. 716/11
2004/0153982 A1 * 8/2004 Zhang et al. ................. 716/4

* cited by examiner

*Primary Examiner*—Leigh Marie Garbowski
(74) *Attorney, Agent, or Firm*—Chernoff, Vilhauer, McClung & Stenzel

(57) ABSTRACT

A computer-based placement and routing (P&R) tool stores a set of circuit patterns, each describing a separate device group by referencing each device of the device group and by indicating which device elements forming the referenced devices are interconnected by nets, a set of placement patterns, each providing a guide for placing IC device elements forming a device group described by a corresponding one of the circuit patterns and a set of routing styles to act as guides for routing nets between device elements placed in particular patterns. To produce a layout for an analog IC described by a netlist, the P&R tool identifies each set of devices in the IC forming a device group described by any of the circuit patterns. The P&R tool then generates a separate device group layout for each identified device group using the placement patterns as guides for placing device elements within the device group layout and using the routing styles as guides for routing nets interconnecting device elements within the device group layout. The P&R tool also generates a layout for each device not included in any identified device group. The tool then generates a layout for the IC incorporating each generated device and device group layout.

21 Claims, 11 Drawing Sheets

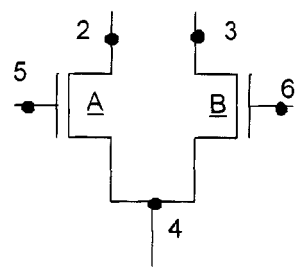
FIG. 18A
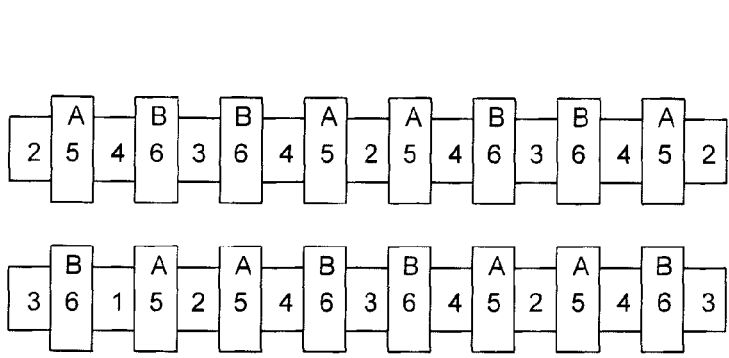
FIG. 18B
ABBAABBA
BAABBAAB
FIG. 18C
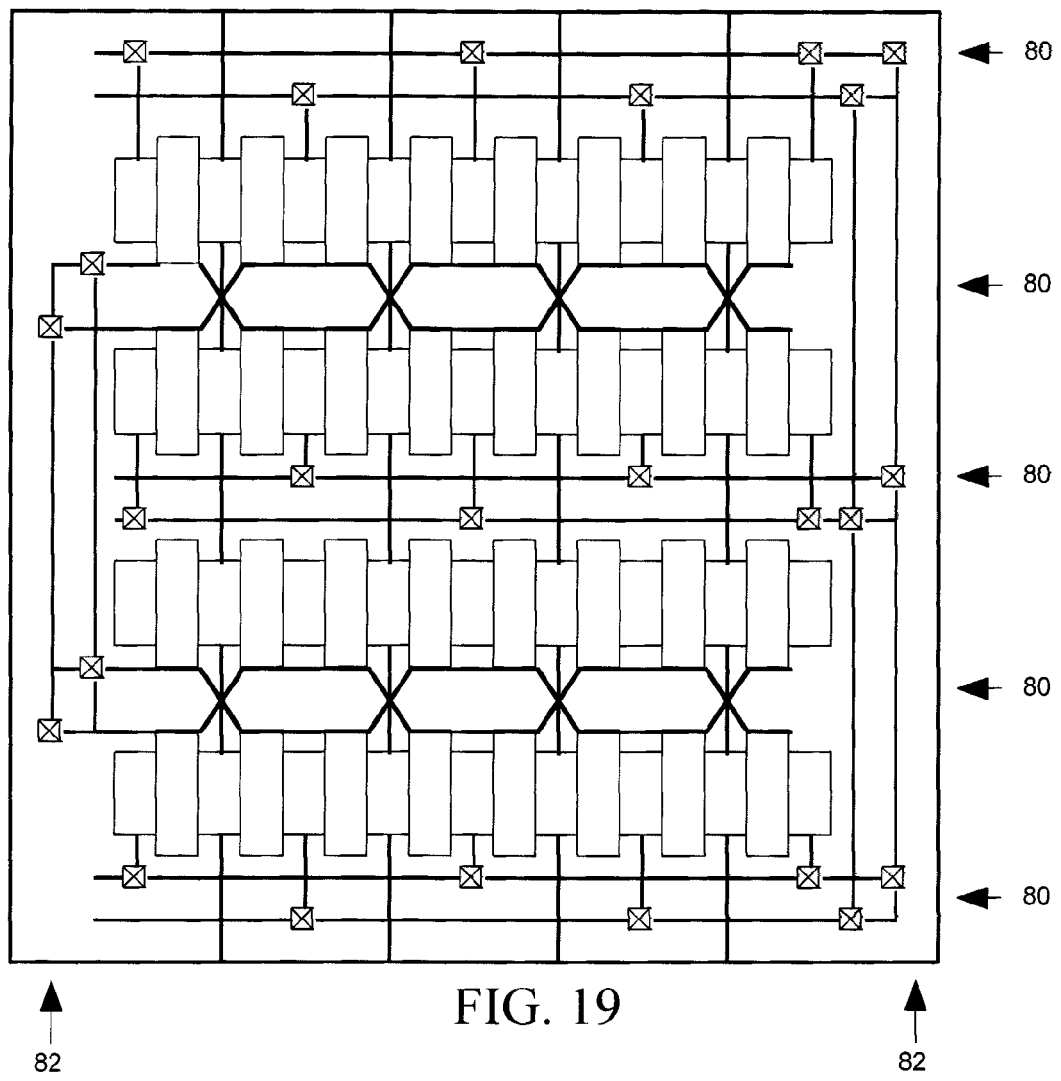
FIG. 19

ANALOG AND MIXED SIGNAL IC LAYOUT SYSTEM

CROSS-REFERENCE TO RELATED APPLICATION

This application claims benefit of U.S. Provisional Application No. 60/851,840 entitled "IC Layout Generation System, filed Oct. 12, 2006.

BACKGROUND OF THE INVENTION

1. Field of the Invention

The invention relates in general to systems for generating layouts for integrated circuits (ICs) and in particular to an automated layout system for analog ICs.

2. Description of Related Art

A circuit designer typically creates an IC design in the form of a netlist referencing circuit devices to be included in the IC and indicating which conductive net is to be connected to each device terminal. A digital IC designer usually processes a netlist description of an IC using a placement and routing (P&R) tool that automatically generates an IC layout indicating the position and orientation of each device within the IC and indicating how conductors forming nets interconnecting device terminals are to be routed within the IC. When generating a layout for a digital IC, the P&R tool treats each device as a separate cell having a predetermined internal layout. The tool iteratively repositions cells and reroutes nets until it arrives at a layout solution satisfying constraints on the size and aspect ratio of the available layout area, on signal path delays, on net widths and spacing, and on power density and other constraints.

Although automated placement and routing tools are widely used for generating digital IC layouts, they are not often used to generate analog IC layouts. A typical analog IC includes circuits formed by transistors and passive devices that must be laid out in particular patterns in order for the circuits to behave properly. For example a pair of transistors forming a differential pair circuit must be closely matched and the differential pair circuit they form must have a symmetric layout in order to properly balance the differential currents they convey. To create a layout for a differential pair circuit, it is not sufficient to merely select a separate layout for each transistor, place each transistor near one another and then route nets interconnecting them. It is necessary to generate a detailed layout for the differential pair circuit as a whole, wherein the gate, drain and source components of the two transistors are appropriately matched and symmetrically distributed and interconnected. Since placement and routing algorithms developed for digital circuits are not adapted for satisfying matching and symmetry constraints and other constraints on analog circuit layouts, designers often resort to manually producing layouts for analog ICs, or for the analog portions of mixed-signal ICs, even though handcrafted layouts can be time-consuming and error-prone.

In the past decade, academia and industry have proposed both "template-driven" and "constraint driven" automated placement and routing tools for analog circuits, but the drawbacks to these systems have prevented them from being widely used. A template-driven automated layout system generates an IC layout by processing a netlist to determine whether any portion of an analog circuit it describes can fit into any one of a set of pre-designed handcrafted layout templates. Each template specifies a complete layout for a separate analog circuit such as for example a current mirror or a differential pair. Although this approach is usually fast and easy and can produce a compact layout when suitable templates are available, it lacks flexibility because it does not allow a layout designer to easily vary the layout from design-to-design when differences in layout constraints require small variations in circuit layout. For example although two current mirror circuits may be schematically similar, they cannot be laid out according to the same layout template if the current mirror circuits require transistors of differing in-factor (i.e. having differing numbers of gate fingers). Even though a designer may have previously generated a template for a current mirror using in-factor 1 transistors, the designer must manually generate another template for a schematically similar current mirror using in-factor 2 transistors. Also though two circuits are schematically similar and are formed of transistors having the same in-factor, they cannot use the same layout pattern if they are subject to differing technology constraints. Differences in technology constraints can also influence device group a layout pattern. The nets that interconnect elements of the various devices of a circuit are subject to width and spacing constraints that can vary from one IC to another depending on the fabrication technology used to make the IC. Thus the number of templates needed to enable a template-based P&R tool to layout an analog ICs having a wide variety of circuits and subject to a wide variety of constraint without much human intervention would be prohibitively large.

A constraint-driven automated layout tool generates an IC layout satisfying various constraints on the layout, including device matching and symmetry constraints, without using predetermined layout templates. FIG. 1 shows the general flow of a typical prior art constraint-driven layout tool. The tool initially analyzes input data 10 including a netlist, a circuit performance specification and technology file to identify groups of devices that are subject to device and net matching and symmetry constraints (step 12). The tool creates a database 14 indicating the constraints on each device or device group and then generates a layout for each device or device group that satisfies all device matching and symmetry constraints (step 16) in database 14. The tool then places the device and device group layouts generated at step 16 in the IC layout and routes the nets interconnecting the device terminals (step 18) to produce a final layout 20. Although the constraint-driven approach is more flexible than the template-driven layout approach, the resulting layout 20 is often not as good in many respects as handcrafted and template-driven layouts.

What is needed is a flexible automated placement and routing system for an analog or mixed signal circuit that can generate high-quality layouts.

SUMMARY OF THE INVENTION

A computer-based placement and routing (P&R) tool in accordance with the invention stores a set of circuit patterns, a set of device group layout patterns and a set of routing styles. The P&R tool permits a user to add, delete and modify circuit patterns, device group layout patterns, and routing styles.

Each circuit pattern corresponds to a separate group of devices ("a device group") that may be incorporated into an analog IC and describes the device group by referencing each device of the group and by indicating which elements of those devices communicate with one another via signals.

Each routing style corresponds to a particular arrangement pattern of device elements within an IC layout and can act as a guide for the P&R tool when routing one or more nets between device elements that have been placed in that particular arrangement pattern.

Each device group layout pattern corresponds to one of the stored circuit patterns and can act as a guide for the P&R tool when placing device elements forming the corresponding device group. Each device group layout pattern may also select suitable routing styles to act as guides for routing nets interconnecting the device elements of the corresponding device group. A "placement and complete routing" type of device group layout pattern selects appropriate routing styles for all nets needed to interconnect elements of its corresponding device group to one another. A "placement and partial routing" type of device group layout pattern selects appropriate routing styles for one or more, but not all, of the nets needed to interconnect elements of its corresponding device group. A "pure placement" type of device group layout pattern includes only a placement pattern for elements of devices forming the corresponding device group and does not select routing styles for any of the nets that are to interconnect those device elements.

To generate a layout for an analog IC described by a netlist, the P&R tool initially processes the netlist, user-supplied input and other information to determine various constraints it must satisfy when it generates the IC layout. The P&R tool also processes the netlist and the stored circuit patterns to identify any device group within the IC matching a device group description of any stored circuit pattern and creates a constraint requiring each identified device group to be laid out in accordance with a device group layout pattern corresponding to the circuit pattern.

The P&R tool then creates a floorplan allocating space within the IC for each identified device group and for each device not included within one of the identified device groups. The P&R tool estimates floor space requirements for each device group based on the device group layout pattern that is to guide generation of the device group layout.

After creating the floorplan, the P&R tool generates a separate layout for each device group based on its selected device group layout pattern and on routing styles specified by the layout patterns. When the device group layout pattern is a pure placement pattern or a placement and partial routing pattern, the P&R tool selects appropriate routing styles for all nets for which the device group layout pattern has not already specified a routing style and routes the nets within each device group based on the selected routing styles. The P&R tool adjusts each device group layout as necessary to satisfy any layout constraints. For example, the P&R tool adjusts halo space around rows of elements forming each device group layout needed for routing nets between device elements as necessary to satisfy constraints on minimum net wire size and spacing. The P&R tool also generates a layout for each device not included in an identified device group.

The P&R tool then places the generated device and device group layouts within the IC layout based on the floorplan and routes nets between individual device and device group layouts in a manner consistent with all layout constraints.

A P&R tool in accordance with the invention can provide device group layouts that are of the quality of prior art template-driven techniques but with the flexibility of prior art constraint-driven layout techniques The claims appended to this specification particularly point out and distinctly claim the subject matter of the invention. However those skilled in the art will best understand both the organization and method of operation of what the applicant(s) consider to be the best mode(s) of practicing the invention by reading the remaining portions of the specification in view of the accompanying drawing(s) wherein like reference characters refer to like elements.

BRIEF DESCRIPTION OF THE DRAWINGS

FIG. 18A is a schematic diagram of an analog circuit.

FIG. 18B is a simplified plan view of a placement plan corresponding to the analog circuit of FIG. 18A.

FIG. 18C is an iconic view of the placement pattern of FIG. 18B.

FIG. 19 is a simplified plan view of a device group laid out in accordance with a selected device group layout pattern and a variety of selected net routing patterns.

DETAILED DESCRIPTION OF THE INVENTION

Figure 1:
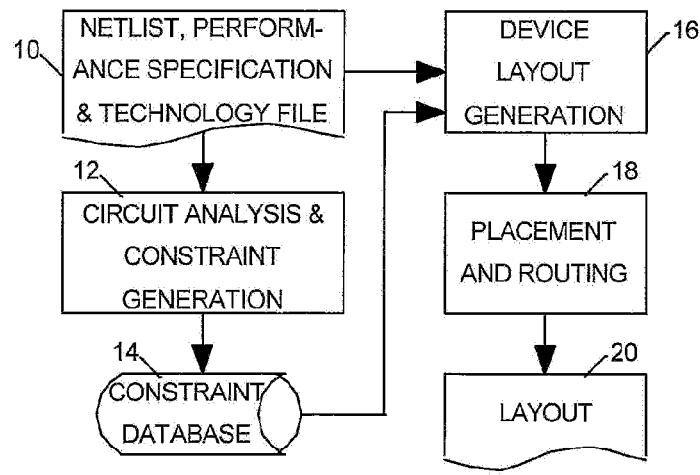
FIG. 1 is a dataflow diagram depicting a prior art constraint-driven analog circuit layout system.

The invention relates to computer-readable media containing software, which when read and executed by a conventional computer, causes the computer to act as an IC placement and routing (P&R) tool for generating a layout for an analog integrated circuit (IC) or for an analog portion of a mixed signal IC. Suitable computer-readable media includes but is not limited to compact disks, hard disks, floppy disks, USB drives, random access memory and read only memory. While a preferred embodiment of the invention is described in detail below and shown in the drawings, those of skill in the art will appreciate that many variations in details of the preferred embodiment are possible. The claims appended to this specification describe the true scope and spirit of the invention.

Figure 2:
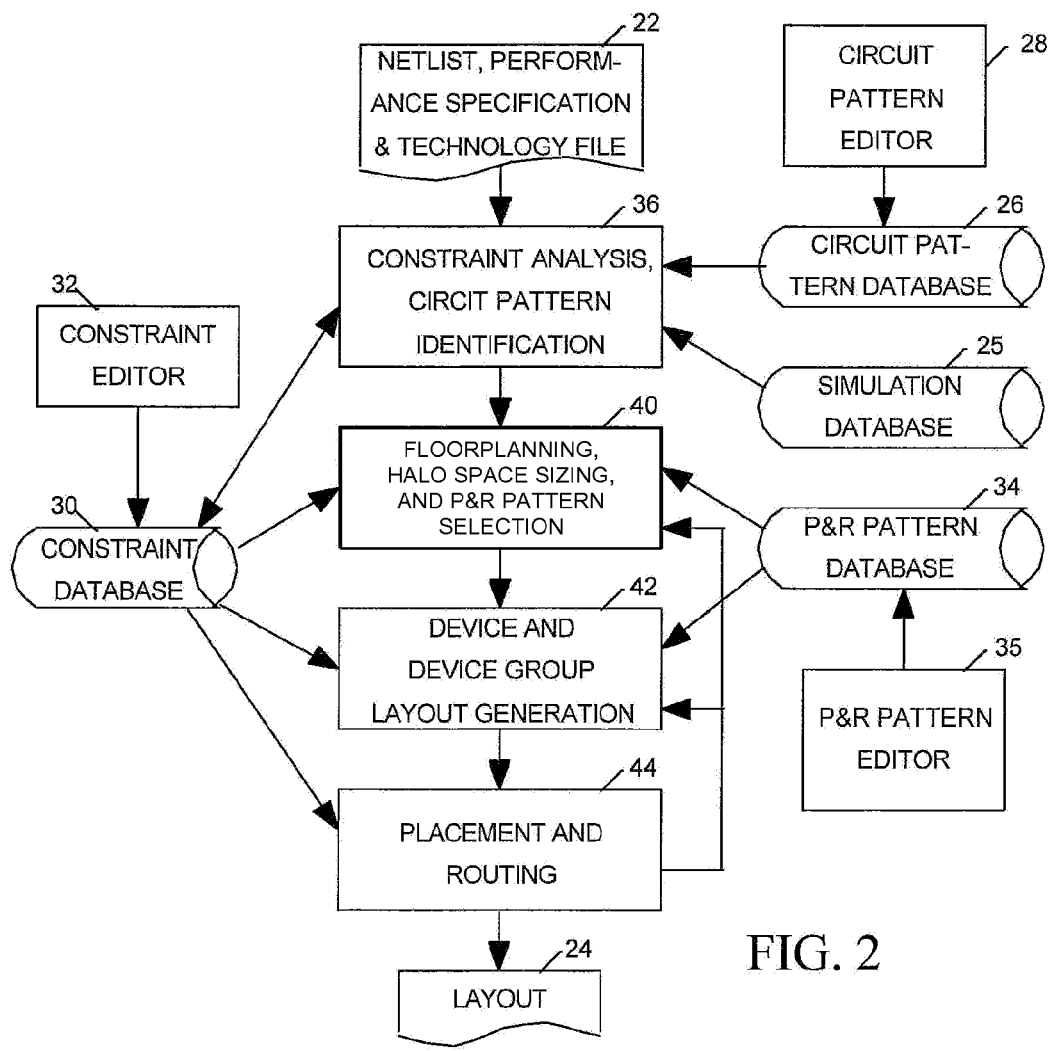
FIG. 2 is a dataflow diagram depicting an analog circuit layout method in accordance with a preferred embodiment of the invention.

FIG. 2 is a dataflow diagram illustrating a method in accordance with a preferred embodiment of the invention carried out by a computer-based P&R tool. The P&R tool processes IC design data 22 and information contained in a set of databases stored in computer memory to produce an IC layout 24 indicating a position within the IC of each element of each circuit device (such as a transistor, resistor, capacitor or other device) implemented within the IC and specifying the routes conductors follow within the IC forming nets to interconnect device elements. The IC design data 22 includes a netlist indicating the devices to be incorporated into the IC and indicating which device terminals are to be interconnected by nets, along with a performance specification and a technology file containing process related parameters and other information.

Databases

A P&R tool in accordance with the invention accesses information that may reside in one or more databases. In the example discussed herein, the P&R tool organizes that information into a simulation database 25, a circuit pattern database 26 and a placement and routing pattern database 34.

Simulation database 25 stores results of a conventional computer-based simulation of the circuit described by the netlist indicating signal behavior and other circuit characteristics. As discussed below, the P&R tool processes information in simulation database 25 to determine various constraints on the IC layout it is to produce.

Circuit pattern database 26 stores a set of circuit patterns, each corresponding to a separate group of devices (a "device group") that may be implemented within an IC. Each circuit pattern describes its corresponding device group by referencing each element of each device of the group and by indicating which device elements communicate with one another via signals. The P&R tool includes a circuit pattern editor 28 allowing a user to add, delete and modify circuit patterns in the circuit pattern database 26.

P&R pattern database 34 contains a set of "routing styles" and a set of "device group layout patterns". Each routing style corresponds to a particular placement pattern of device elements within an IC layout and can guide the P&R tool when routing one or more nets between device elements placed in that particular pattern. Although each routing style corresponds to a particular device element placement pattern, P&R pattern database 34 can include more than one routing style for the same device element placement pattern and can therefore describe more than one way to route nets between device elements placed in a particular pattern.

Circuit pattern database 26 may store one or more device group layout patterns corresponding to each device group described by circuit pattern in circuit pattern database 26. Each device group layout pattern indicates how elements of devices forming its corresponding device group can be arranged within an IC layout. Each device group layout pattern may also select one or more of the routing styles to act as guides for routing nets needed to interconnect the device elements of the corresponding device group. A "placement and complete routing" type of device group layout pattern selects appropriate routing styles for all nets needed to interconnect elements of its corresponding device group to one another. A "placement and partial routing" type of device group layout pattern selects appropriate routing styles for one or more, but not all, of the nets needed to interconnect elements of its corresponding device group. A "pure placement" type of device group layout pattern includes a device group layout pattern for elements of devices forming its corresponding device group but does not select routing styles for any of the nets that are to interconnect those device elements. Using a placement and routing pattern editor 35, a user may add, delete and modify routing styles and device group layout patterns in P&R pattern database 34.

The Layout Process

Referring to FIG. 2, the P&R tool initially processes the design data 22 and the simulation database 25 (step 36) to identify devices and nets that are subject to various layout constraints and writes data into constraint database 30 describing those constraints. The user may also add, modify or delete data in constraint database 30 using a constraint editor 32 to add, modify or delete various layout constraints. User-defined constraints may, for example, specify the dimensions of the available IC layout area, desired positions of IC I/O ports or other devices, and other constraints. User-supplied constraint data may also identify particular device groups within the IC that match circuit patterns in circuit pattern database 26 and may indicate that such device groups are to be laid out in accordance with particular device group layout patterns contained in P&R pattern database 34.

The P&R tool can automatically identify constraints on device layouts based on information in the netlist and other design data 22 including, for example, on transistor size and m-factor constraints, and chain, device matching, and link constraints. The P&R tool can also process design data 22 to identify net constraints including, for example, net size and spacing, differential pair, equal length, net property, shielding, and symmetry constraints. The P&R tool employs conventional means to process simulation database 25 to automatically extract layout constraints on individual nets such as minimum wire widths and shielding constraints, for example by analyzing the current density of each signal net and by determining which nets convey high frequency signals that require shielding. As discussed in more detail below, the P&R tool also processes the netlist at step 36 to identify each device group matching any one of the circuit patterns described in circuit pattern database 26 not already so identified by user-supplied constraint data. For each identified device group, the P&R tool writes constraint data into constraint database 30 identifying those device groups.

After identifying layout constraints at step 36 and updating constraint data in constraint database 30 to indicate those constraints, the P&R tool (step 40) generates an IC floorplan reserving space within the IC layout for each device group and for each device not included in a device group. To create the floorplan, the P&R tool checks constraint database 30 to determine the size and shape of the available layout area, to determine whether constraint data in the constraint database has identified any device groups and to determine whether the constraint data has selected appropriate device group layout patterns for any of the identified device groups. If the constraint data has not selected a particular device group layout pattern for an identified device group, the P&R tool selects a device group layout pattern from P&R pattern database 34 corresponding to the circuit pattern of device group. The P&R tool then estimates floor space requirements for each device group based on its selected device group layout pattern and based on various layout constraints included in constraint database 26 such as, for example, constraints on minimum net size and spacing of nets. The P&R tool then creates the floorplan of the IC layout area reserving space for each device group and for each device not included in a device group. The P&R tool adjusts the floorplan as necessary to accommodate any constraints indicated by constraint data stored in constraint database 30 including constraints on the size and shape of the IC layout area, constraints on placement of IC input/output ports, constraints requiring certain devices or device groups to be placed in particular positions, and any other relevant constraints defined in constraint database 30.

After creating the floorplan at step 40, the P&R tool generates a separate layout for each device group based on its selected device group layout pattern and generates a layout for each device referenced by the netlist but not included in any identified device group (step 42). When the device group layout pattern for a device group is a placement and complete routing pattern specifying a suitable routing style for every net that is to interconnect elements of the device group, the P&R tool arranges elements of the device group in accordance with the device group layout pattern and then uses the specified routing styles as guides for routing nets between those device elements. When the device group layout pattern for a device group is a pure placement layout pattern or a placement and partial routing pattern, the P&R tool selects appropriate routing styles for all nets for which the device group layout pattern has not already specified a routing style and then routes the nets within the device group in accordance with the selected routing styles.

After generating a layout for each device and device group at step 42, the P&R tool generates the entire IC layout (step 44) by positioning each device and device group layout in the IC layout in accordance with the floorplan and by employing a conventional routing algorithm to determine a route for each net that is to interconnect the device groups and other devices. Steps 40, 42 and 44 are iterative in that if the P&R tool is unable to develop a suitable layout 24 at step 44 based on the current floorplan and device group layouts, it may return to step 42 to modify one or more device group layouts, or to step 40 to modify the floorplan.

Circuit Patterns

During step 36 of FIG. 2, the P&R tool processes the netlist to identify device groups matching circuit patterns stored in circuit pattern database 34, such as matching transistor pairs, current mirrors and other circuits. For each device group matching one of the stored circuit patterns, the P&R tool creates an entry in constraint database 26 requiring the device group to be laid out in accordance with a corresponding placement and routing pattern stored in P&R pattern database 34.

Figure 3:
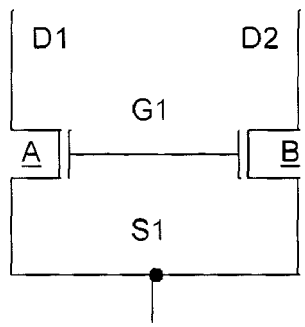
FIG. 3 is a schematic diagram depicting an example circuit pattern.

Circuit pattern database 26 describes a set of circuit patterns, each corresponding to a separate group of devices. Each circuit pattern describes each device of its corresponding group and indicates which elements forming the devices of the group are to communicate with one another via signals. Circuit devices forming a device group can include transistors, capacitors, inductors, resistors and other devices that can be implemented within an IC. Circuit pattern database 26 categorizes circuit patterns according to the number and type of matching devices within the device group, the m-factor (number of gate areas) of each transistor device, and the manner in which elements of the matching devices are interconnected. A circuit pattern does not, however, indicate how elements forming each device are to be positioned within a device group layout or indicate how nets interconnecting those elements are to be routed. For example, FIG. 3 shows a matching pair circuit pattern comprising two transistors A and B having common gate and source connections. The gate elements of transistors A and B communicate via a common signal G1, their source elements communicate via a common signal S1, and their drain elements communicate via separate signals D1 and D2. For this circuit to operate properly it is necessary for the drain-to-source paths of transistors A and B and the nets conveying signals G1, S1, D1 and D2 to be symmetric in order to balance the currents they convey.

Device Group Layout Patterns

As mentioned above, P&R pattern database 34 stores a set of device group layout patterns and a set of routing styles. Each device group layout pattern includes a placement pattern that the P&R tool can use as a guide for positioning elements of device groups matching the circuit patterns stored in database 26. Each device group layout pattern may or may not also select suitable routing styles for the nets needed to interconnect device group elements.

Figure 4:
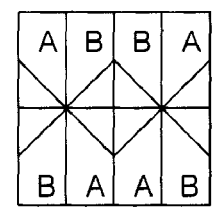
FIG. 4 is a checkerboard view of a device group layout pattern associated with the circuit pattern of FIG. 3.
Figure 5:
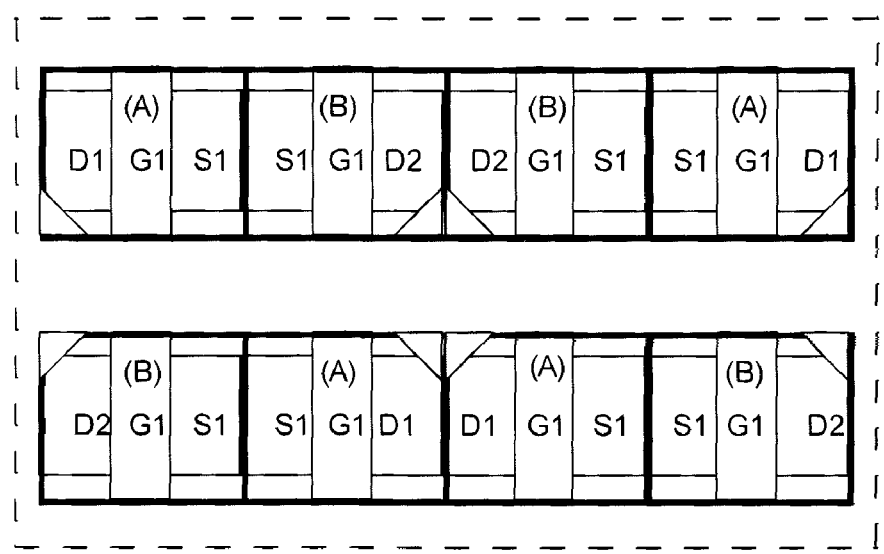
FIG. 5 is an abstract view of a device group layout pattern associated with the circuit pattern of FIG. 3.
Figure 6:
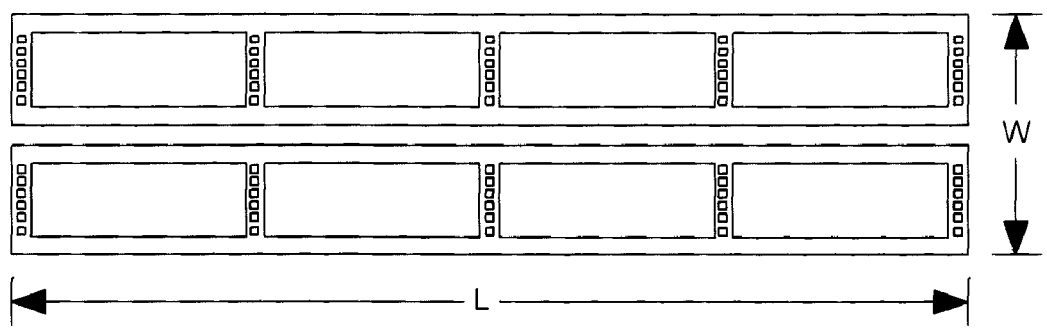
FIG. 6 is a simplified view of a placement plan corresponding to the device group layout pattern of FIGS. 4 and 5.

FIGS. 4-6 show three views of a placement pattern that could be incorporated into a device group layout pattern corresponding to the matching pair circuit pattern of FIG. 3 for in-factor=4 transistors. FIG. 4 shows a "checkerboard" view of the placement pattern indicating only the position and orientation of each device along one or more placement rows. A shaded triangle in the corner of each transistor indicates the relative position of its drain element. An "abstract" view illustrated in FIG. 5 shows each element of each transistor and includes labels on the elements indicating the signals each transistor element receives. A "layout" view of FIG. 6 shows the actual layout of the placement pattern including the actual size and shape of each device element.

In the placement pattern depicted in FIG. 4-6, each transistor A and B has four gate, drain and source elements arranged along two adjacent rows. The gate elements appear in an "ABBA" sequence along one row and in a "BAAB" sequence along the second row. This device group layout pattern, called an "ABBA BAAB" pattern, is symmetric with respect to the two transistors and can implement the matching pair circuit pattern of FIG. 3 in a way that provides balanced drain-source currents when the P&R tool appropriately routes nets interconnecting the various gate, drain and source device elements to one another and to other circuit devices. A user can employ circuit placement editor 28 of FIG. 2 to create a placement pattern for a given circuit pattern by generating such a symbolic representation of the pattern as illustrated in FIG. 4. When the user has assigned all device elements to squares of the checkerboard, the editor automatically creates the abstract view of the placement pattern as shown in FIG. 5 and the placement plan view of FIG. 6.

When a suitable device group layout pattern for a particular device group is not available in P&R pattern database 34, the P&R tool can prompt a user to use pattern editor 36 to create a suitable new device group layout pattern for that device group and store it in P&R pattern database 34. The P&R tool can thereafter use that device group layout pattern when generating a device group layout for that particular device group in other IC layout projects.

Thus each device group layout pattern in P&R pattern database 34 includes a placement pattern indicating the number of rows of elements that are to form a device group, and indicating the number, size, shape and row ordering of each element of each transistor or other device forming a device group, thereby providing the P&R tool with a guide for generating a placement plan for a device group having a particular circuit pattern. While a device group layout pattern indicates device elements are to be arranged in a particular manner in one or more rows within a device group layout, and indicates how device element rows are to be aligned within one another, it does not specify the amount of "halo space" to be provided around each row to accommodate routing of nets that are to interconnect device elements. A device group layout pattern treats the amount of halo space surrounding each row needed for routing nets between those device elements as a variable since the amount needed depends not only on the routing style to be used but also on net spacing and sizing constraints described in constraint database 40 that can vary depending on requirements of the particular IC fabrication technology to be used and other factors. Thus the length (L) and length width (W) of the area to be occupied by a device group laid out in accordance with the placement plan of FIG. 6 can vary depending on the amount of halo space needed around each row. When generating the floorplan at step 40 of FIG. 2, the P&R tool estimates the length and width of the space required by each device group based not only on the device group layout pattern selected for the device group, but also on various constraints in constraint database 30 that influence the amount of halo space needed for routing nets between elements of the device group. Since the P&R tool can adjust the spacing between device element rows within a device group layout, it can use the same device group layout pattern as a guide for laying out a device group within ICs that are subject to differing constraints on net width and spacing.

Routing Styles

While each device group layout pattern stored in P&R pattern database 34 includes a placement pattern for guiding placement of elements of devices forming a device group, it does not directly indicate how to route nets between those device elements. A device group layout pattern can, however, specify particular routing styles as guides for routing nets between device elements of its corresponding device group. When a device group layout pattern does not select a routing style for one of more of the nets needed to interconnect the elements of a device group, the P&R tool automatically selects routing styles for those nets that are appropriate for the placement patterns exhibited by those device elements.

Figure 7:
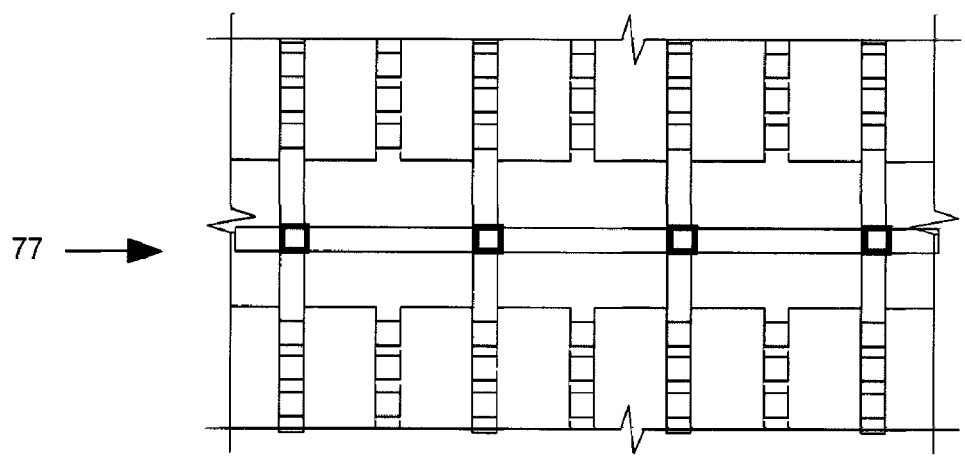
FIGS. 7-9 are plan views depicting various net routing patterns.
Figure 8:
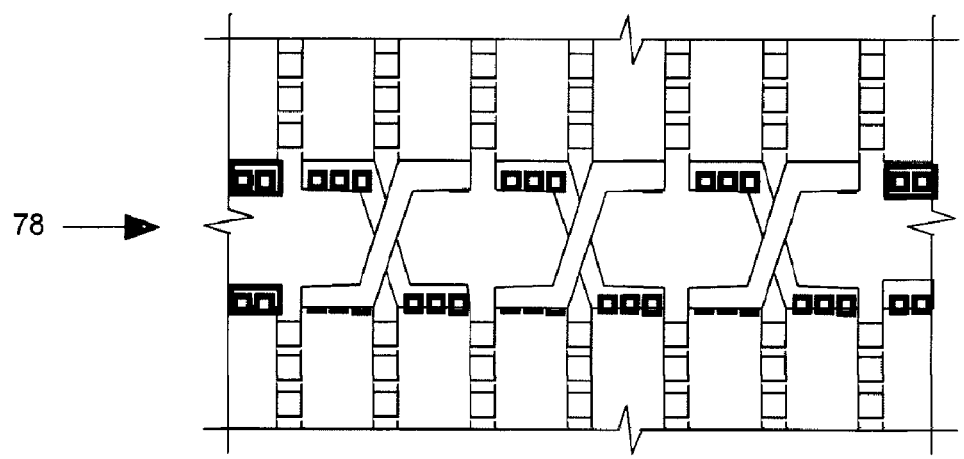
Figure 9:
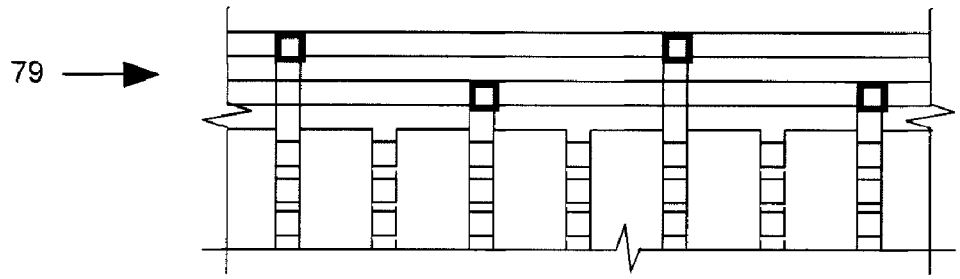

FIGS. 7-9 show three example routing styles that can be included in P&R pattern database 34 for interconnecting device elements arranged in accordance with various device element placement patterns. FIG. 7 shows a "backbone" routing style 77 for interconnecting adjacent elements residing on adjacent rows, FIG. 8 shows a "cross" routing style 78 for interconnecting non-adjacent elements residing on adjacent rows, and FIG. 9 shows a "matched backbone" routing style 79 for interconnecting elements residing on the same row. When a routing style for interconnecting a set of device elements arranged in a particular pattern is not available in P&R pattern database 34, the P&R tool can prompt a user to use routing pattern editor 36 to create a suitable routing style for that device arrangement and store it in P&R pattern database 34. The P&R tool can thereafter use that routing style on other IC layout projects whenever it encounters a similar device element placement pattern within a device group layout.

Circuit Pattern Recognition

Figure 10:
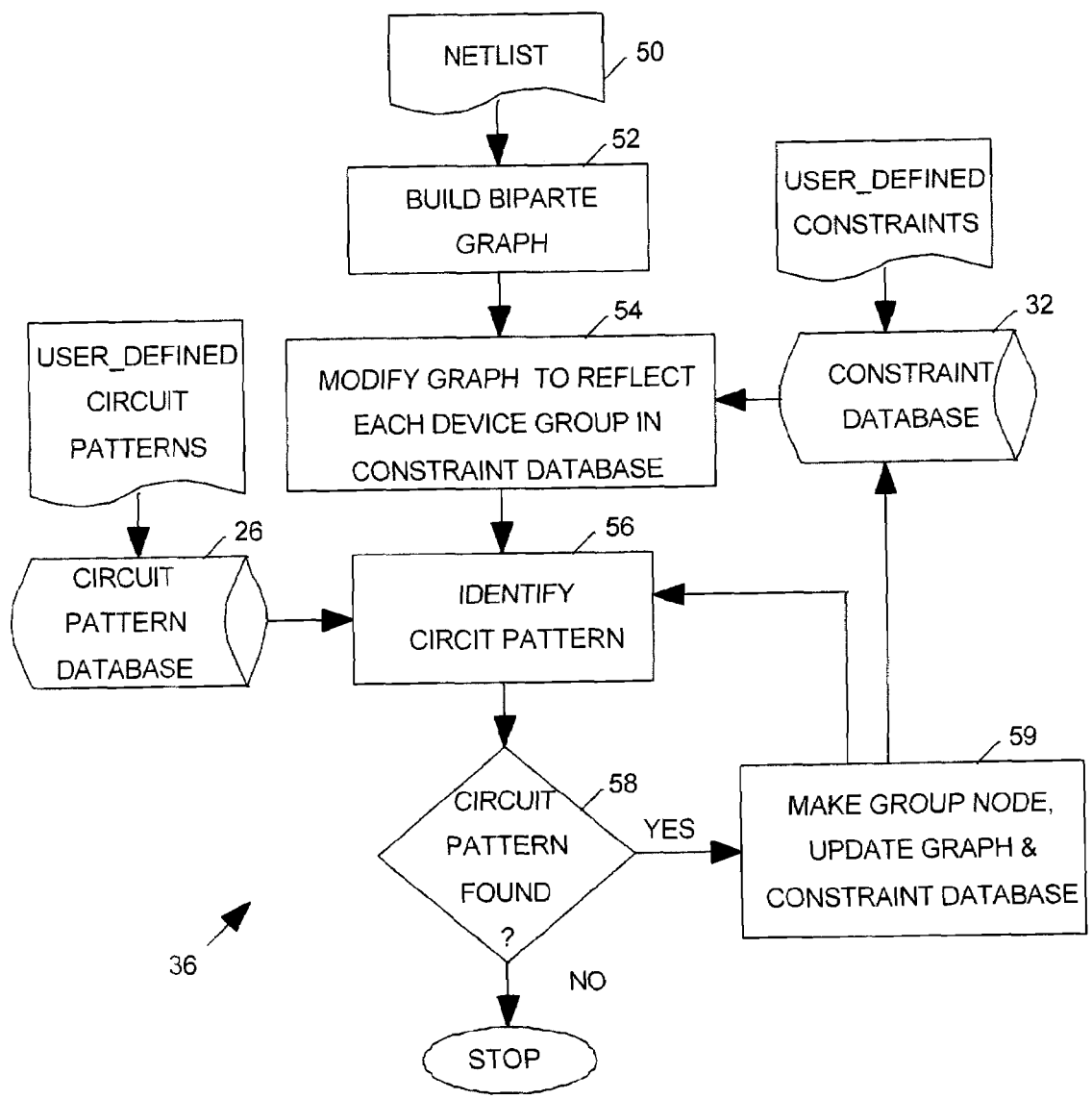
FIG. 10 is a dataflow diagram depicting a portion of the constraint analysis and circuit pattern identification step of the method of FIG. 2.
Figure 11:
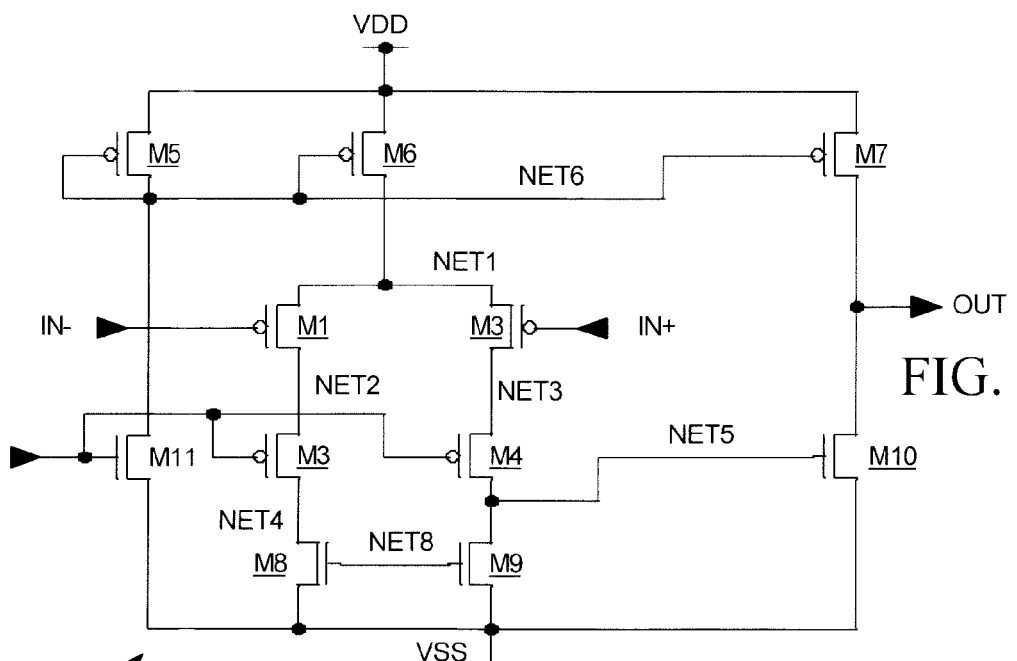
FIG. 11 is a schematic diagram depicting an example analog circuit.
Figure 12:
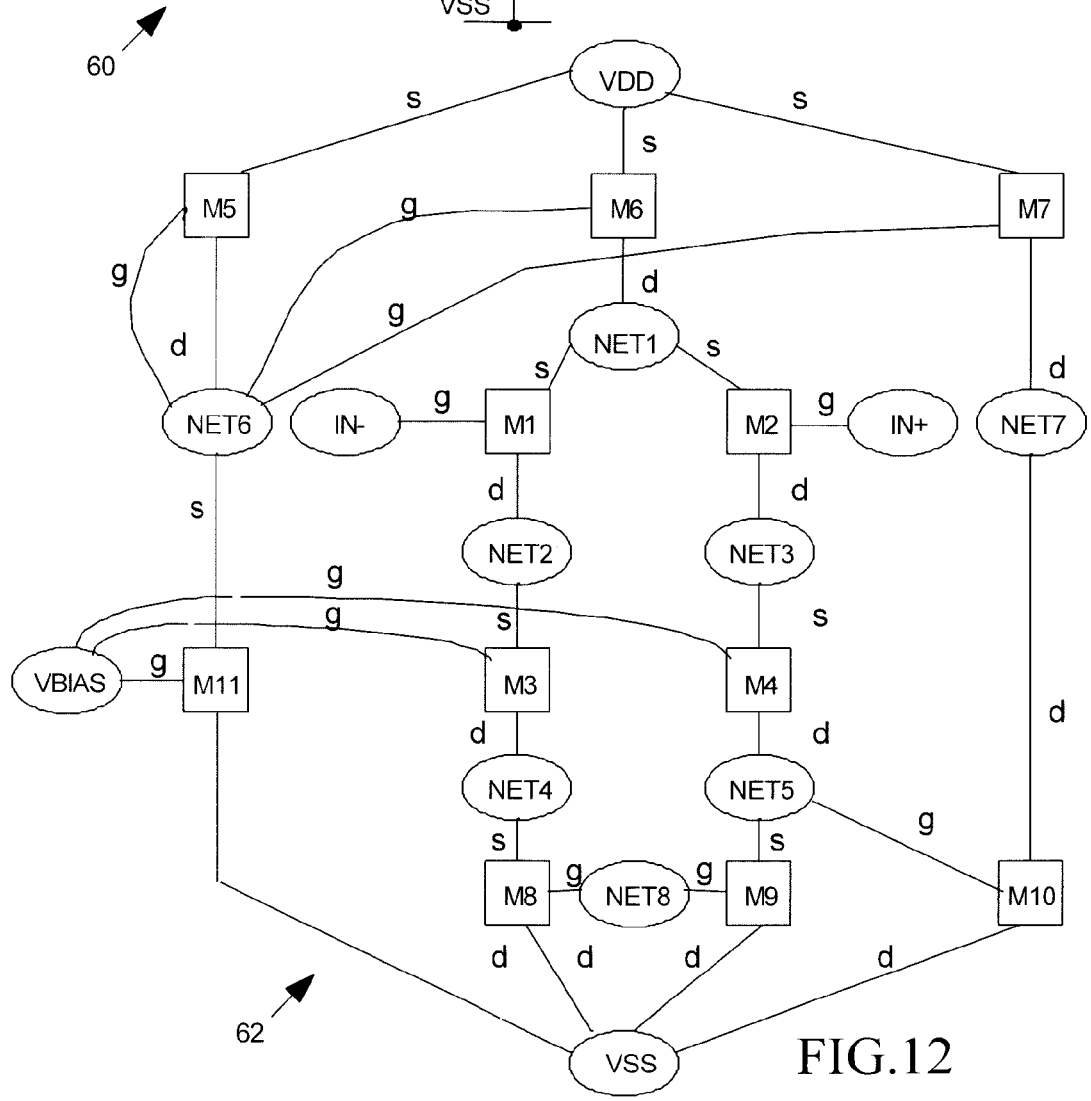
FIGS. 12-15 are successive versions of a bipartite graph representing current flows in the circuit of FIG. 8.

FIG. 10 is a dataflow diagram depicting step 36 of FIG. 2 in more detail showing how the P&R tool goes about processing a netlist 50 to identify device groups arranged in circuit patterns for which circuit pattern database 26 contains corresponding placement. Initially (step 52), the P&R tool processes netlist 50 describing the circuit to produce a bipartite graph for use in identifying device groups. The bipartite graph includes a separate node representing each device and each net and a separate edge representing each device-net interconnection. FIG. 11 is a schematic diagram of an example circuit 60 that netlist 50 might describe, and FIG. 12 illustrates a corresponding bipartite graph 62 the P&R tool produces at step 52 to provide a basis for circuit pattern recognition. In graph 62 rectangular device nodes represent devices M1-M11 of circuit 60 and elliptical signal nodes represent the nets NET1-NET8, VBIAS and BDD of circuit 60. Each edge between a device node and a signal node is annotated with a letter indicating which pin of a device represented by the device node transmits or receives a signal conveyed by the net represented by the net node. A label such as s, d or g on an edge denotes whether the device pin is a source, drain or gate.

Referring to FIG. 10, after generating the bipartite graph at step 52, the P&R tool next (step 54) determines whether constraint database 32 indicates that any set of devices referenced by the netlist as a device group is to be laid out in accordance with a device group layout pattern selected from P&R pattern database 34. The user may use the constraint editor 32 (FIG. 2) to create constraints identifying such devices as forming such a device group. For each device group identified in constraint database 32, the P&R tool modifies the graph at step 54 to replace the nodes representing that set of devices and the nodes representing their interconnecting nets with a single node representing the entire device group. The P&R tool then processes the graph to look for any other device groups arranged in circuit patterns referenced by circuit pattern database 26 (step 56). If such a device group is found (step 58), the P&R tool updates the graph to replace the nodes representing that set of devices and their interconnecting nets with a single node representing the device group. The P&R tool also updates constraint database 32 to indicate the devices form a device group to be laid out in accordance with a device group layout pattern stored in P&R database 26 and to indicate that their interconnecting nets are subject to symmetry constraints (step 59). The P&R tool repeats steps 56, 58 and 59 until it has identified each device group and added an appropriate constraint to constraint database 32.

To identify device groups from the graph of FIG. 12 at step 56, the P&R tool first processes the graph to trace all drain-source current flows from one power source (VDD) to another (VSS). For the example graph 62 of FIG. 12, the P&R tool will identify the following four current flows.

1. VDD>M5>net6>M11>VSS
2. VDD>M6>net1>M1>net 2>M3>net4>M8>VSS
3. VDD>M6>net1>M2>net3>M4>net 5>M9>VSS
4. VDD>M7>net7>M10>VSS The P&R tool then studies the current flows to identify two flows as being a "symmetry group" wherein all of the following are true:
   a. the two current flows include the same number of devices
   b. similar devices occupy similar positions in each current flow, and
   c. the two current flows share at least one common net or device node other than VDD and VSS.

The netlist indicates the size and nature of each device. The P&R tool can initially identify flows 2 and 3 as a forming symmetry group because each flow includes four transistors in the flow path, if the set of transistors (M6, M1, M3 M8) of flow 2 respectively match the set of transistors (M6, M3, M4, M9) of flow 3, and 4 the two flows share a common net node (net1) other than VDD and VSS.

Having identified flows 2 and 3 as a symmetry group, the P&R tool identifies the set of all device symmetry pairs within the symmetry group. A "device symmetry pair" is any pair of devices having the same size and order within the two flows of the symmetry group. Flows 2 and 3 contain the following device symmetry pairs: (M1, M2), (M3, M4), (M8, M9). Each symmetry pair is a device group exhibiting a circuit pattern for which circuit pattern database 26 may provide a corresponding placement pattern.

Figure 13:
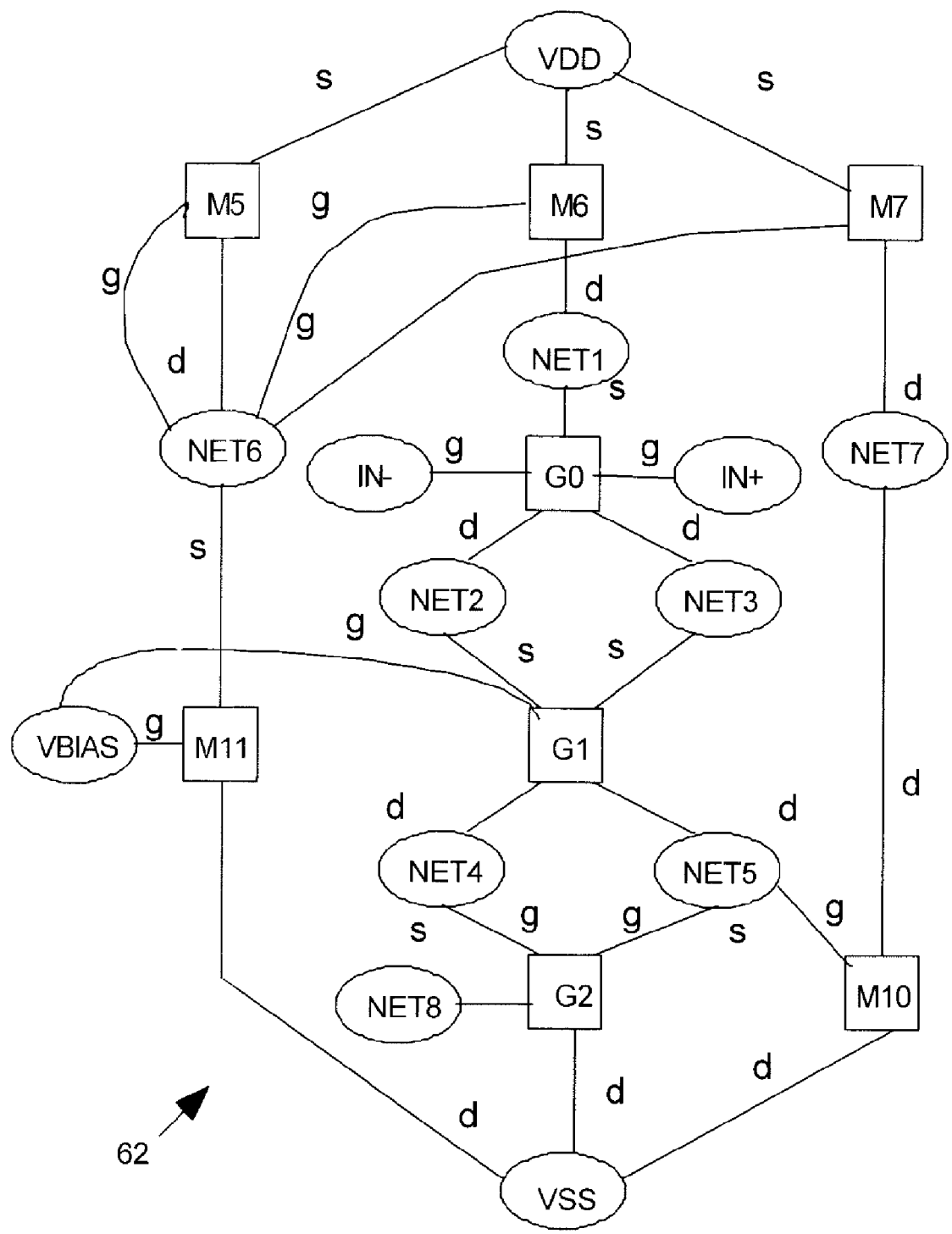

The P&R tool selects a suitable device group layout pattern, if any, for each symmetry device pair from database 26 tool at step 56 and then, if a device group layout pattern is found (step 58) modifies the graph as shown in FIG. 13 (step 59) to replace nodes for pair M1/M2 with a single group node "G0", to replace nodes for pair (M3, M4) with a single group node "G1", and to replace nodes for pair (M8, M9) with a single group node "G2". The P&R tool also updates constraint database 32 at step 59 to indicate that transistor pairs (M1, M2), (M3, M4), and (M8, M9) are to be implemented by the selected device group layout patterns.

Figure 14:
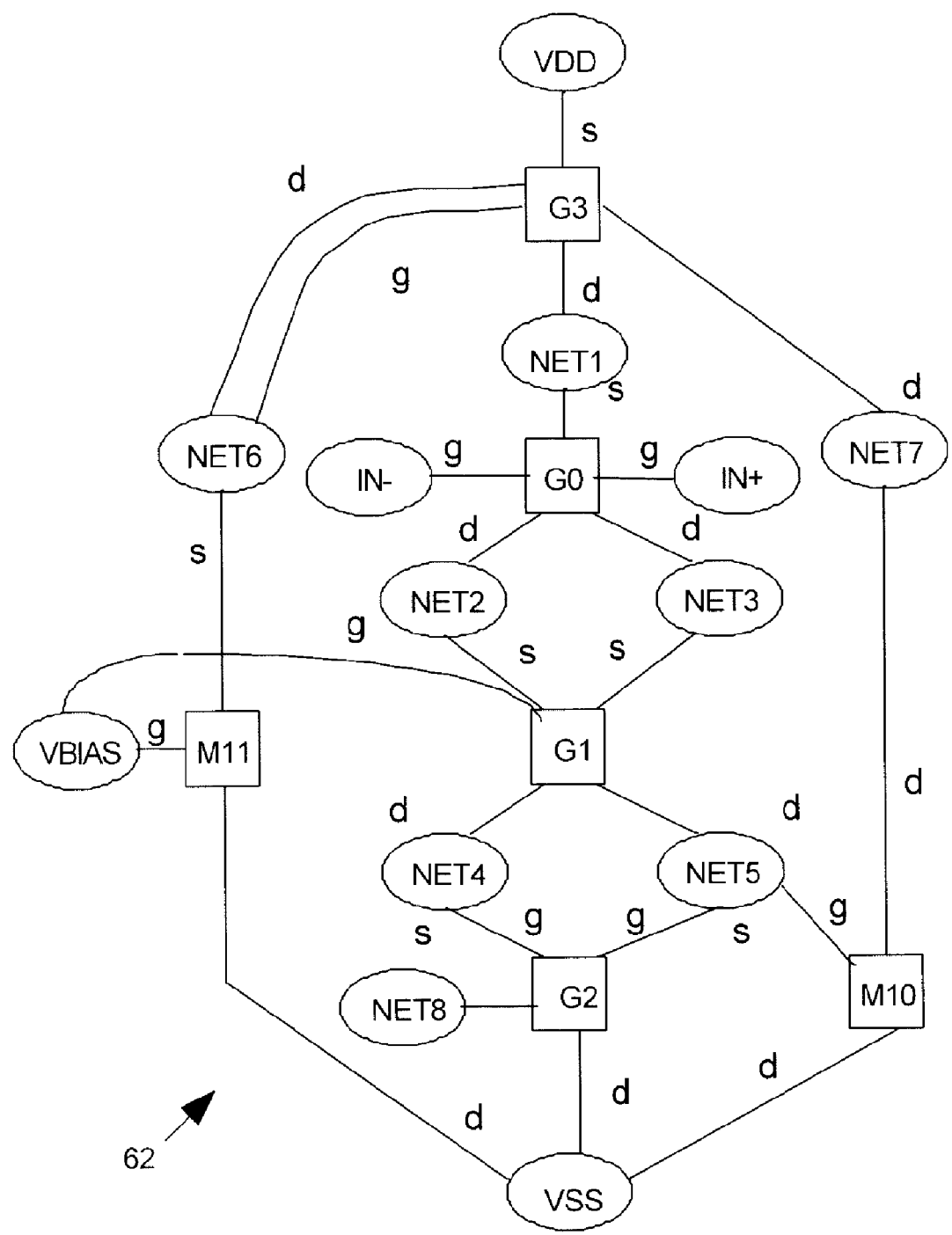
Figure 15:
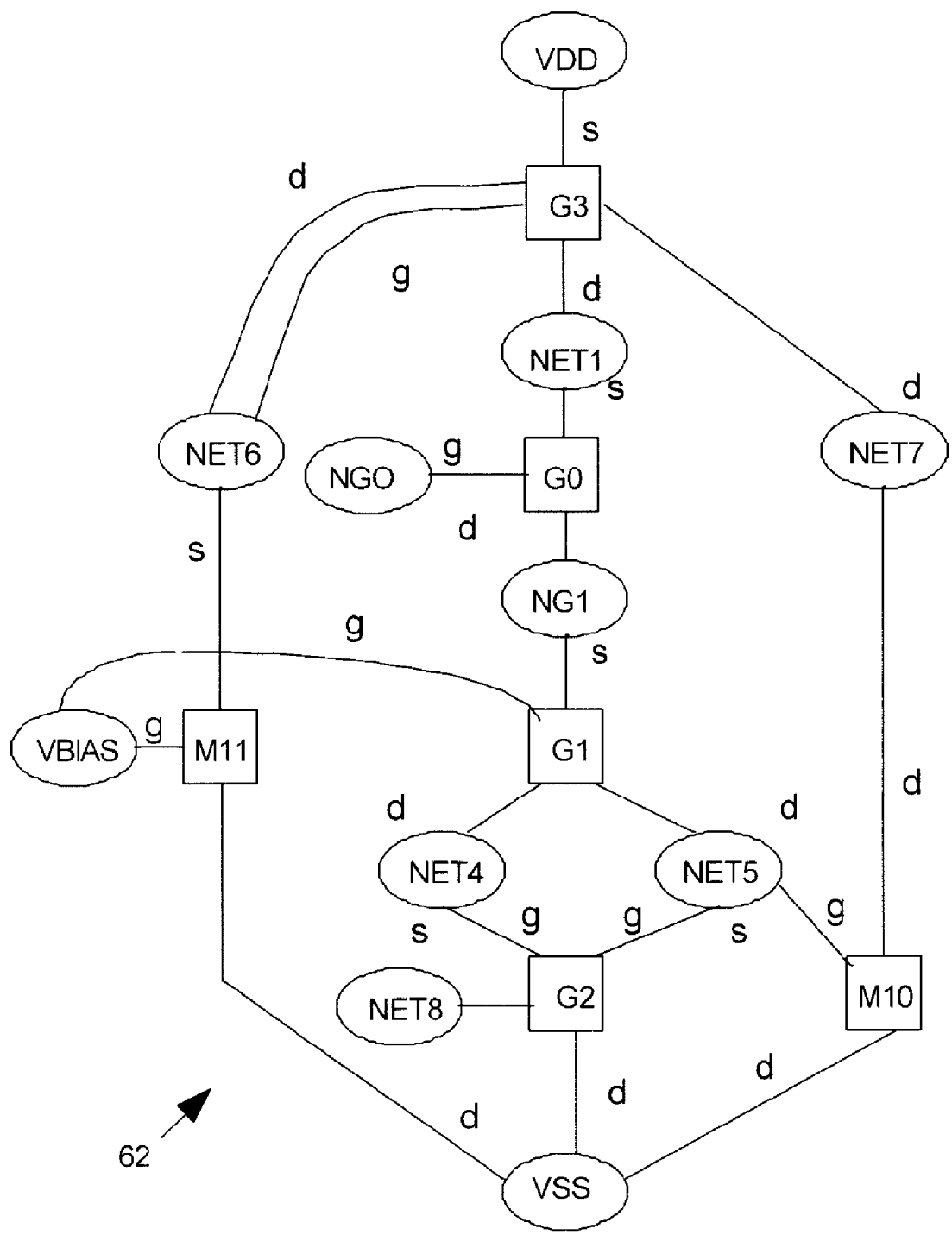

Returning to step 56, the P&R tool next sees the following flows of the graph of FIG. 12
1. VDD>M5>net6>M11>VSS
2. VDD>M6>net1>G0>net2>G1>net4>G2>VSS
3. VDD>M6>net1>G0>net3>G1>net5>G2>VSS
4. VDD>M7>net7>M10>VSS Circuit pattern database 26 can provide circuit patterns for various other device groups such as, for example current mirrors. When transistors M5, M6 and M7 are of the same size, they form well-known current mirror circuit because their sources are connected to a common node VDD, and their gates are connected to the drain of one of the three transistors. If database 26 includes an entry for this current mirror pattern, then during a pass through step 56, the P&R tool will identify devices M5, M6 and M7 as a device group to be placed in accordance with a device group layout pattern corresponding to that circuit pattern. Thus during a next pass through step 59, the PR tool modifies the graph of FIG. 13 to replace the nodes for devices M5, M6 and M7 with a single device group node G3 as shown in FIG. 14 and adds the constraint to database 32 indicating devices M5, M6 and M7 should be laid out according to the selected device group layout pattern in circuit pattern database 26. The current flows of FIG. 14 are as follows:
1. VDD>G3>net6>M11>VSS
2. VDD>G3>net1>G0>net2>G1>net4>G2>VSS
3. VDD>G3>net1>G0>net3>G1>net5>G2>VSS
4. VDD>G3>net7>M10>VSS Any pair of nets connected to corresponding terminals of any device symmetry pair exhibits a "net symmetry pair" pattern. In the graph of FIG. 14, the P&R tool identifies the set of net symmetry pairs" {(net2, net3), (IN+, IN−)} at step 59, and updates constraint database 32 to indicate that those net symmetry pairs should have symmetrical layouts and can update the graph to replace net symmetry nodes with net symmetry group nodes as illustrated in FIG. 15. The current flows of FIG. 15 are as follows:
1. VDD>G3>net6>M11>VSS
2. VDD>G3>net1>G0>NG1>G1>net4>G2>VSS
3. VDD>G3>net1>G0>NG1>G1>net5>G2>VSS
4. VDD>G3>net7>M10>VSS The constraint analysis process 36 of FIG. 6 ends at step 58 when the P&R tool is not able to identify any additional device group from the graph matching a circuit pattern stored in database 26.

Device Size Estimation and Floorplanning

At step 36 of FIG. 2, the P&R tool estimates the length and width of the IC area that will be needed for each identified device group and each device not included in an identified device group. At step 40, the P&R tool generates a floorplan reserving space for those devices and device groups. To estimate the size of a device group, the P&R tool searches P&R database for a suitable layout pattern for the device group, and then estimates the size of the device group based on the number of rows of elements of a device group, the size each device element within each row and on relevant wire size, minimum wire spacing and shielding and all relevant constraints stored in constraint database 26.

Given the estimated length and width of each device group and of each device not included in a device group, the P&R tool (step 40) employs a conventional floorplanning algorithm to generate an IC floorplan indicating a position and orientation within the layout for each such device and device group layout, subject to all floorplanning constraints stored in constraint database 32. Floorplanning constraints may include constraints on the size and shape of the IC layout area, constraints on placement of IC input/output, predetermined power/ground topologies, placement area aspect ratio constraints and other constraints. Suitable prior art floorplanning algorithms such as for example various versions of the B*tree method are well known to those of skill in the art and are not further detailed herein.

Routing Pattern Recognition and Device Layout Generation

Figure 16:
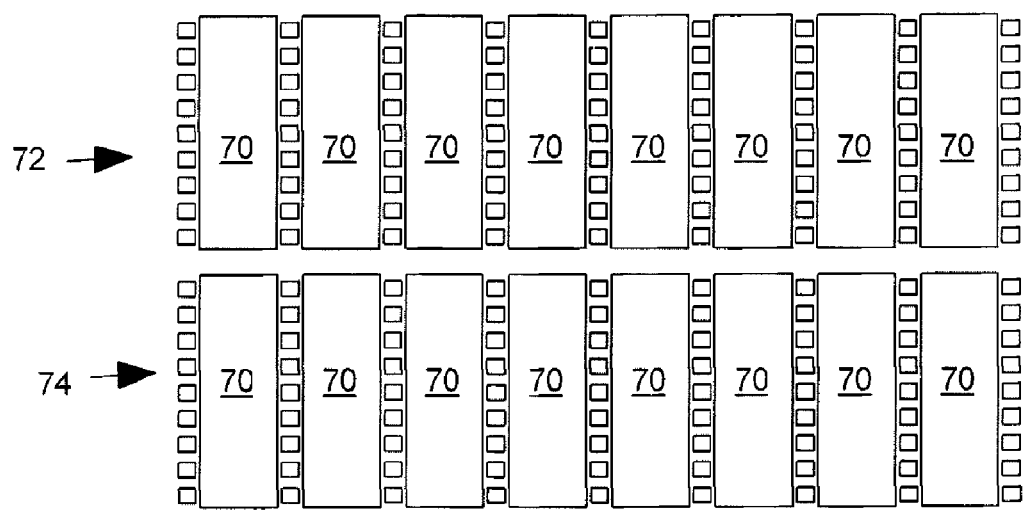
FIG. 16 is a plan view of elements of devices arranged in accordance with a device group layout pattern stored in the pattern database of FIG. 2.
Figure 17:
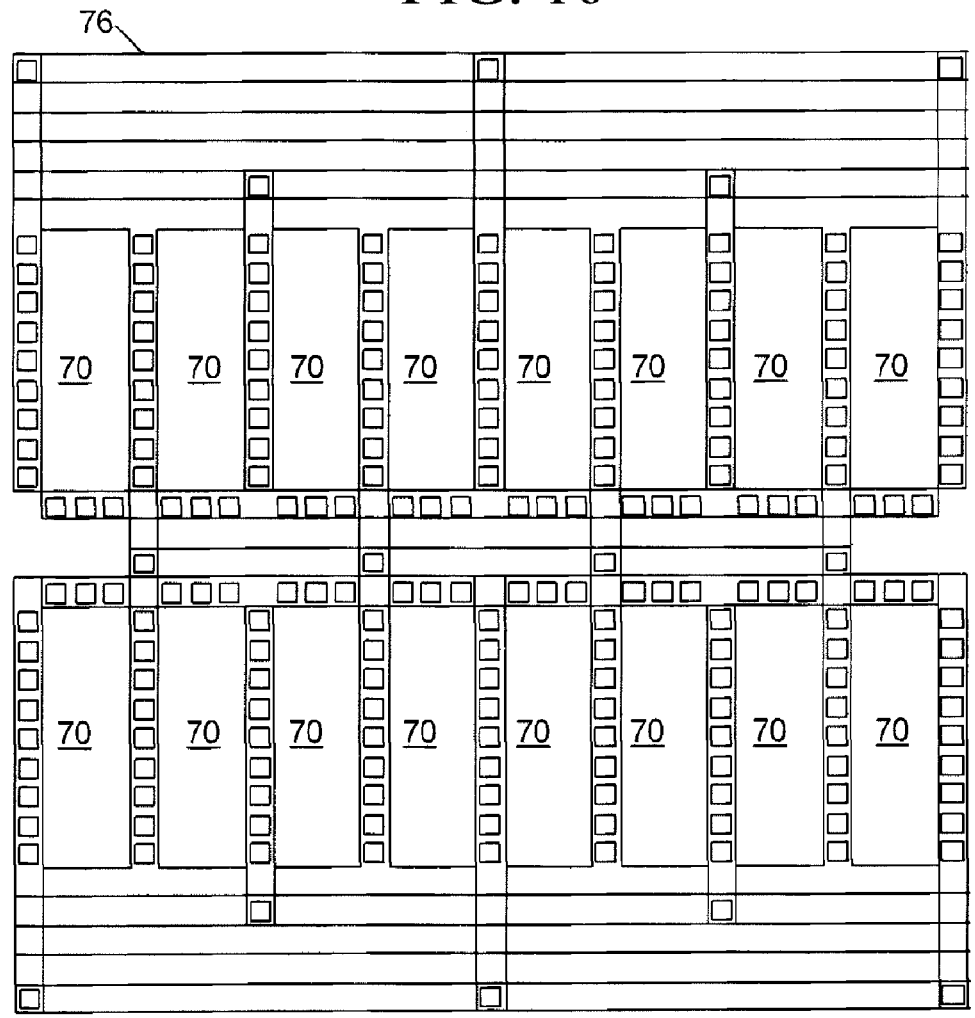
FIG. 17 is a plan view of a layout of a device group employing the device group layout pattern of FIG. 16 including nets interconnecting device elements.

After generating the floorplan at step 40, the P&R tool (step 42, FIG. 6) creates a separate layout for each identified device group based on the group's selected layout pattern subject to any constraints stored in constraint database 26 relative to the devices and nets forming the device group. FIG. 16 depicts (in simplified form) a placement pattern that may be included in a layout pattern for a device group wherein various device elements 70 are arranged along two rows 72 and 74. At step 42, the P&R tool selects suitable routing styles from P&R pattern database 34 for routing nets 76 interconnecting the device elements, appropriately sizes the halo space around element rows to accommodate the selected routing styles given wire size, spacing and other routing constraints identified in constraint database 26. FIG. 17 depicts (in simplified form) a resulting layout for the device group.

When a device group layout pattern selected for a particular device group does not indicate the routing style to be employed for one or more of the nets that are to interconnect elements of the device group, the P&R tool uses matching analysis at step 42 to select a suitable routing style for each such net based on the placement topology within the device group layout pattern of the device elements to be interconnected. For example, FIG. 18A shows a circuit pattern for a device group formed by two transistors A and B connected to nets 2 through 6. FIG. 18B shows a corresponding two-row placement pattern the P&R tool might select for guiding the device group layout. FIG. 18O is an iconic view of the placement pattern of FIG. 18B showing that elements are placed in an ABBAABBA/BAABBAAB pattern. Each device element in FIG. 18B is labeled with the number of the net to be connected to the elements. In this case, the P&R tool will recognize nets 2 and 3 as matching (symmetric) nets because both nets are connected to the source or drain of MOS A or B, because they each have the same number of connection points in the pattern, and because the connection points follow a common centroid topology (i.e., 23232 in the upper row and 32323 in the lower row). The P&R tool chooses routing styles for nets 2 and 3 that are appropriate to that topology. Similarly, the P&R tool recognizes nets 5 and 6 of the gate connections of MOS A and B as matching nets and chooses appropriate routing styles for those nets.

FIG. 19 is a simplified abstract depiction of a device group layout employing various routing styles in the horizontal and vertical channels 80 and 82. The P&R tool first selects appropriate routing styles for the nets to be routed in the horizontal channels 80, and then generates a horizontal channel routing plan consistent with all routing constraints, adjusting the size of the halo space surrounding each device group row as necessary to accommodate the nets. The P&R tool then establishes a virtual pin group for horizontal conductor ends that are to be interconnected in the vertical channels and selects a suitable backbone routing style for the vertical channels 82 to interconnect wires of the same net among different horizontal channels. The wire size and spacing, the spacing between pins, the net extension style and other characteristics of each routing style stored in P&R pattern database 34 are variables controlled by a set of routing parameters.

Figure 20:
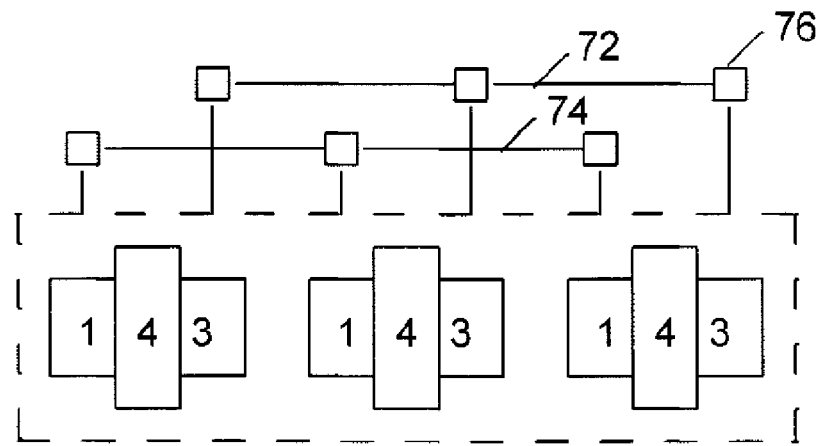
FIGS. 20-22 are simplified plan views of example extension styles that can be applied to a routing pattern.
Figure 21:
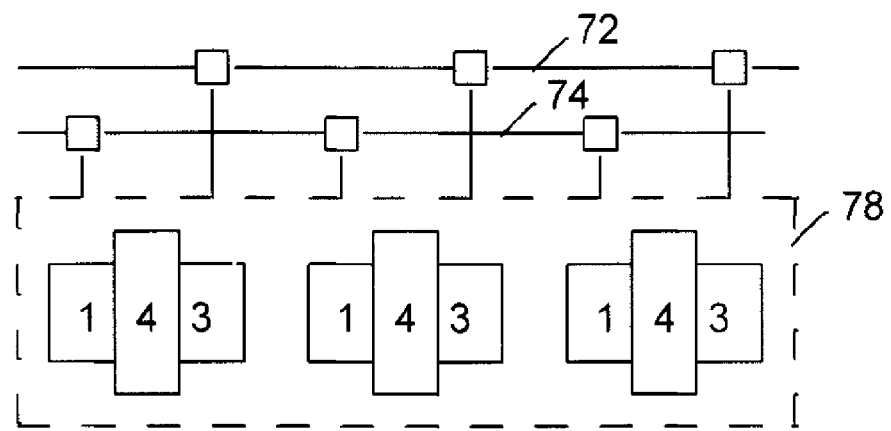
Figure 22:
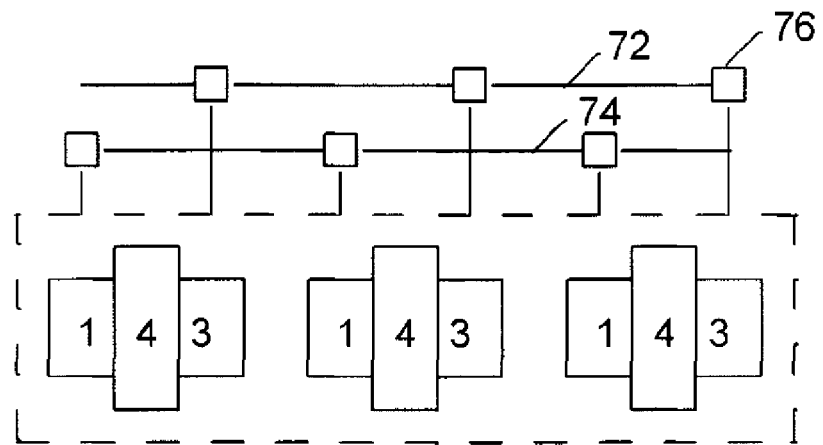

The P&R tool selects appropriate parameter values for each instance of a routing style based on routing constraints stored in constraint database 26 which may be supplied by the user or generated automatically by the P&R tool during the device group layout process For example, FIGS. 20-22 show various net extension styles for the backbone type of routing pattern. In the "to pin" net extension style of FIG. 19, the nets 72 and 74 interconnecting elements 1 and 3 extend only to the element terminals 76. In the "to channel" net extension style of FIG. 21, the nets 72 and 74 extend to the channels 78 at opposing ends of the device group layout. In the "alignment" net extension style of FIG. 22, the nets 72 and 74 are of similar length and each net extends as far as necessary beyond the device pins 76 it interconnects to align with the corresponding end of the other net. The layout of FIG. 19 includes routing patterns exhibiting each of the extension styles.

The P&R tool determines a sequence in which to select routing styles within a device group in accordance with a set of pre-defined priorities. A group of pins to be interconnected by a net (a "pin group") having a user-specified routing style has higher priority than a pin group not having a user-specified routing pattern and is therefore routed first. A pin group of a matching-net pair has higher priority than a pin group of a non-matching-net pair. A pin group routable in cross style has higher priority than a pin group routable in backbone style. A pin group requiring a shorter backbone net has higher priority than a pin group requiring a longer backbone. The P&R tool suitably routes nets in the horizontal channels before routing nets in the vertical channels and routes guard-ring net last.

Inter-Device Routing

After generating a separate layout for each device group and for each device not included in a device group, and after positioning each device and device group in the IC layout in accordance with the floorplan at step 42 of FIG. 2, the tool completes the IC layout 24 by placing the device and device group layouts in the IC layout 24 in accordance with the floorplan and then generating an inter-device routing plan indicating routes for nets interconnecting the device groups and devices not included within device groups (step 44). The inter-device routing plan is suitably implemented, for example, by a conventional tile-based gridless router considering routing constraints stored in constraint database 30 including, for example, differential pair routing, equal length routing, net shielding, and symmetry routing constraints. After completing the routing of any constrained nets in a pre-defined, or user-specified routing sequence, unconstrained nets can be routed, for example, by a conventional blockage-aware routing algorithm followed by a conventional gridless detailed routing algorithm. Steps 40, 42 and 44 may be iterative in that if the P&R tool is unable to develop a suitable inter-device routing plan at step 44 based on the current floor plan and device group layouts, it may return to step 42 to modify one or more device group layouts, or may return to step 40 to modify the floorplan.

An intelligent layout generation system in accordance with the invention integrates automatic circuit and simulation data analysis, constraint extraction, placement-driven pattern-based device generation, and shape-based routing technologies to facilitate custom layout generation.

The invention claimed is:

1. Computer readable media containing software which, when read and executed by a computer, causes the computer to act as a placement and routing tool by carrying out a method for generating a layout for an analog IC described by a netlist as comprising a set of devices interconnected by nets, wherein each device comprises at least one device element and at least some of the devices from device groups each comprising a plurality of device elements and at least one net interconnecting at least two device elements, the method comprises the steps of:

a. providing a set of placement patterns, each providing a guide for placing device elements forming a device group within a device group layout for the device group;

b. for each placement pattern, providing a set of routing styles to act as guides for routing nets between device elements placed in that particular placement pattern;

c. identifying device groups in the netlist;

d. generating a floorplan allocating space within the IC layout for each device group and selecting a placement pattern for each device group and a routing style for each net of the device group;

e. generating a separate device group layout for each device group identified at step c, wherein placement of device elements within each device group layout is guided by the placement pattern selected at step d, and wherein routing of nets interconnecting device elements within the device group layout is guided by the routing styles selected at step d; and f. generating the layout for the IC, wherein the layout for the IC incorporates each device group layout generated at step e, and placement of the device group layouts within the IC layout is guided by the floorplan.

2. The computer readable media in accordance with claim 1 wherein step a comprises providing at least one device group layout pattern that includes a placement pattern for a device group, step b comprises including in the device group layout pattern a routing style for at least one net interconnecting device elements of the device group of the placement pattern, and in step d the floorplan selects the routing style included in the device group layout pattern for said one net.

3. The computer readable media in accordance with claim 1 wherein the placement patterns indicate device elements forming device groups are to be aligned in device element rows, and wherein the net routing styles comprise:

a backbone routing style for interconnecting device elements residing in separate rows, a cross routing style for interconnecting device elements residing in separate rows, and a matched backbone routing style for interconnecting device elements residing a single device element row.

4. The computer readable media in accordance with claim 1 further comprising the step of g. creating the routing styles provided at step b in response to user input.

5. The computer readable media in accordance with claim 1 wherein the method further comprises the step of:

g. altering at least one of the routing styles provided at step-c step b in response to user input.

6. The computer readable media in accordance with claim 1 further comprising the steps of:

g. providing a set of circuit patterns, each describing a separate device group by referencing each device of the device group and by indicating which device elements forming the referenced devices are interconnected by nets; and h. identifying each set of devices in the IC forming a device group described by any of the circuit patterns prior to step e.

7. The computer readable media in accordance with claim 6 further comprising the step of
   i. creating the circuit patterns provided at step g in response to user input.

8. The computer readable media in accordance with claim 6 wherein the method further comprises the step of:
   i. altering at least one of the set of circuit patterns provided at step g in response to user input.

9. The computer readable media in accordance with claim 6 wherein step h comprises receiving input from a user identifying at least one set of devices described by the netlist as being included in the IC as forming a device group described by any of the circuit patterns.

10. The computer readable media in accordance with claim 6 wherein step h comprises processing the netlist to identify at least one set of devices included in the IC as forming a device group described by one of the circuit patterns.

11. The computer readable media in accordance with claim 6 wherein step h comprises:
   h1. processing the netlist to identify current flows formed by devices and nets providing current paths between a first power source (VDD) and a second power source (VSS);
   h2. identifying each set of two current flows forming a matching group wherein the two current flows include a similar number of devices, similar devices occupy similar positions in each current flow, and the two current flows share at least one common device or net; and
   h3. determining whether each identified matching group is described by any one of the circuit patterns.

12. The computer readable media in accordance with claim 1 wherein the method further comprises the step of
   g. generating separate device layouts for all devices described by the netlist that are external to all device groups identified at step e,
   wherein the layout for the IC generated at step f incorporates each device layout generated at step g and indicates how nets interconnecting the separate device layouts and the device group layouts are to be routed within the IC.

13. The computer readable media in accordance with claim 12,
   wherein the placement patterns indicate device elements are to be aligned in device element rows within device group layouts, and
   wherein step e comprises sizing halo space surrounding device element rows within the generated device group layouts to accommodate routing of nets interconnecting device elements within the device group layouts.

14. The computer readable media in accordance with claim 12,
   wherein device group layouts are adjusted at step e to satisfy predetermined minimum net width and minimum net spacing constraints on nets interconnecting device elements within the device group layouts.

15. The computer readable media in accordance with claim 12 further comprising the step of
   h. establishing constraints on the IC layout, wherein the layout for the IC is adjusted when generated at step f to satisfy the established constraints.

16. The computer readable media in accordance with claim 15 wherein device group layouts are adjusted at step e to satisfy constraints established at step h.

17. The computer readable media in accordance with claim 15 further comprising a step of:
   i. processing simulation data describing behavior of the IC described by the netlist to establish at least one of the constraints at step h.

18. The computer readable media in accordance with claim 15 wherein step h comprises receiving user input identifying at least one of the constraints.

19. The computer readable media in accordance with claim 12, wherein the floorplan influences device group layouts generated at step e.

20. The computer readable media in accordance with claim 1 further comprising the step of
   g. creating the placement patterns provided at step a in response to user input.

21. The computer readable media in accordance with claim 1 wherein the method further comprises the step of:
   g. altering at least one of the placement patterns provided at step a in response to user input.

* * * * *